(12) United States Patent
Lim et al.

(10) Patent No.: US 11,984,907 B2
(45) Date of Patent: May 14, 2024

(54) ANALOG-TO-DIGITAL CONVERTING CIRCUIT RECEIVING REFERENCE VOLTAGE FROM ALTERNATIVELY SWITCHED REFERENCE VOLTAGE GENERATORS AND REFERENCE VOLTAGE CAPACITORS AND OPERATING METHOD THEREOF

(71) Applicant: Samsung Electronics Co., Ltd., Suwon-si (KR)

(72) Inventors: Yong Lim, Seoul (KR); Jaehoon Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1 day.

(21) Appl. No.: 17/564,668

(22) Filed: Dec. 29, 2021

(65) Prior Publication Data

US 2022/0239310 A1  Jul. 28, 2022

(30) Foreign Application Priority Data

Jan. 22, 2021  (KR) .................. 10-2021-0009741
May 6, 2021  (KR) .................. 10-2021-0058820

(51) Int. Cl.
*H03M 1/12* (2006.01)
*H03M 1/08* (2006.01)
*H03M 1/46* (2006.01)

(52) U.S. Cl.
CPC ............. *H03M 1/468* (2013.01); *H03M 1/08* (2013.01); *H03M 1/462* (2013.01)

(58) Field of Classification Search
CPC .. H03M 1/1215; H03M 1/468; H03M 1/1245; H03M 1/002; H03M 1/12;
(Continued)

(56) References Cited

U.S. PATENT DOCUMENTS 7,190,291 B2 * 3/2007 Markowski ........... H02M 1/082
341/172
7,397,012 B2 * 7/2008 Stepniak ................ H01H 33/02
218/139

(Continued)

FOREIGN PATENT DOCUMENTS

WO  WO-2017-054885 A1  4/2017

OTHER PUBLICATIONS

C. Liu et al., 'A 10 bit 320 MS/s Low-Cost SAR ADC for IEEE 802.11ac Application in 20 nm CMOS' *IEEE*, vol. 50, No. 11, 2015, pp. 2645-2654.

(Continued)

*Primary Examiner* — Linh V Nguyen
(74) *Attorney, Agent, or Firm* — Harness, Dickey & Pierce, P.L.C.

(57) ABSTRACT

An analog-to-digital converting circuit for converting an analog signal into a digital signal includes a plurality of reference voltage generators each generating a reference voltage, a plurality of reference voltage decoupling capacitors respectively corresponding to the reference voltage generators, and an analog-to-digital converter generating a comparison voltage based on the reference voltage and generating the digital signal corresponding to the analog signal based on a result of comparing the comparison voltage with the analog signal. At least one different combination of the reference voltage generators and the reference voltage decoupling capacitors is connected to the analog-to-digital converter in each of a plurality of conversion periods.

17 Claims, 16 Drawing Sheets

(58) Field of Classification Search
CPC .... H03M 1/466; H03M 1/804; H03M 1/0612; H03M 1/123; H03M 1/001; H03M 1/34; H03M 1/442; H03M 1/662; H03M 1/802; H03M 3/47; H03M 3/496
USPC ........ 341/118–121, 141, 142, 139, 150, 155, 341/172
See application file for complete search history.

(56) References Cited

U.S. PATENT DOCUMENTS

| | | | |
|---|---|---|---|
| 7,400,283 B1* | 7/2008 | Zhu | H03M 1/1225 341/122 |
| 7,439,898 B1 | 10/2008 | Nittala et al. | |
| 8,279,101 B1* | 10/2012 | Stevenson | H03M 1/0827 341/122 |
| 8,421,658 B1 | 4/2013 | Yau et al. | |
| 8,451,160 B1* | 5/2013 | Zhou | H03M 1/1215 341/161 |
| 8,497,795 B2* | 7/2013 | Le Tual | H03M 1/468 341/163 |
| 8,902,093 B1* | 12/2014 | Leuciuc | H03M 1/1245 341/172 |
| 9,590,650 B1* | 3/2017 | Kull | H03M 1/1014 |
| 9,641,189 B2 | 5/2017 | Maddox et al. | |
| 9,935,643 B1* | 4/2018 | Chang | H03M 1/462 |
| 9,973,202 B2 | 5/2018 | Yoshioka et al. | |
| 9,979,582 B1* | 5/2018 | Kappes | H04L 27/2666 |
| 10,637,495 B2 | 4/2020 | Shen et al. | |
| 10,693,487 B1 | 6/2020 | Lei et al. | |
| 10,727,856 B2 | 7/2020 | Wu et al. | |
| 2012/0133439 A1* | 5/2012 | Lin | H03M 1/002 330/260 |
| 2017/0047940 A1 | 2/2017 | de Figueiredo et al. | |
| 2017/0199540 A1* | 7/2017 | Tseng | G05F 3/30 |
| 2019/0372581 A1* | 12/2019 | Jang | H03M 1/0854 |
| 2020/0014395 A1* | 1/2020 | Chaput | H02M 3/33576 |
| 2021/0075413 A1* | 3/2021 | Kawai | H03M 1/12 |

OTHER PUBLICATIONS

R. Kapusta et al., "A 14b 80 MS/s SAR ADC with 73.6 dB SNDR in 65 nm CMOS," IEEE Journal of Solid-State Circuits, vol. 48, No. 12, Dec. 2013.
Extended European Search Report dated Jun. 20, 2022 in European Application No. 21218330.5.

* cited by examiner

ANALOG-TO-DIGITAL CONVERTING CIRCUIT RECEIVING REFERENCE VOLTAGE FROM ALTERNATIVELY SWITCHED REFERENCE VOLTAGE GENERATORS AND REFERENCE VOLTAGE CAPACITORS AND OPERATING METHOD THEREOF

CROSS-REFERENCE TO RELATED APPLICATIONS

This application is based on and claims priority under 35 U.S.C. § 119 to Korean Patent Application Nos. 10-2021-0009741, filed on Jan. 22, 2021 and 10-2021-0058820, filed on May 6, 2021, in the Korean Intellectual Property Office, the disclosures of which are incorporated by reference herein in their entirety.

BACKGROUND

The inventive concepts of the present disclosure relate to an analog-to-digital converting circuit, and more particularly, to an analog-to-digital converting circuit receiving a reference voltage from alternately switched reference voltage generators and reference voltage capacitors.

To generate a reference voltage (e.g., used to convert a signal sampled from an analog input signal into a digital signal) an analog-to-digital converting circuit may include at least one reference voltage generator. An analog-to-digital converter (ADC) may include, for example, a successive approximation regulator (SAR) ADC. A reference voltage generator may provide high-frequency of a peak current, which is generated during the switching operation of a capacitive digital-to-analog converter (CDAC), to an ADC.

In general, a reference voltage of an ADC is supposed to have a constant value (e.g., based on a standard) to generate an exact digital signal by comparing the comparison voltage with a voltage of a sampled input signal. However, a reference voltage providing a peak current having a high-frequency signal characteristic may be changed due to the peak current, and a digital signal generated from a comparison voltage generated from a changed reference voltage may have distortion. To prevent this distortion, a reference voltage generator with a high output current and/or a high-capacitance reference voltage capacitor requiring a large area is usually used. However, with growing demand for more integration, and lower energy, the demand for ADCs with low power requirements and smaller footprints has also increased.

SUMMARY

The inventive concepts provide an analog-to-digital converting circuit for generating a reference voltage, which is provided to an analog-to-digital converter, with low power and a small area and an operating method thereof.

According to an aspect of the inventive concepts, there is provided an analog-to-digital converting circuit including a plurality of reference voltage generators each configured to generate a reference voltage; an analog-to-digital converter configured to generate a comparison voltage based on the reference voltage and the analog signal, and generate a digital signal corresponding to an analog signal based on a result of comparing the comparison voltage with a common voltage; a plurality of decoupling capacitors connected to the plurality of reference voltage generators, respectively, wherein at least one of the plurality of decoupling capacitors is connected to the analog-to-digital converter in each of a plurality of time periods.

According to another aspect of the inventive concept, there is provided an analog-to-digital converting circuit including a plurality of reference voltage generation circuits including at least a first reference voltage generation circuit and a second reference voltage generation circuit; an analog-to-digital converter configured to generate a digital signal corresponding to an analog signal based on a reference voltage provided from the plurality of reference voltage generation circuits; a plurality of switches respectively configured to control connections between the analog-to-digital converter and the plurality of reference voltage generation circuits, wherein one of the plurality of switches is configured to be activated and connect one of the plurality of reference voltage generation circuits to the analog-to-digital converter during one of a plurality of time periods.

According to a further aspect of the inventive concept, there is provided a method of converting an analog signal to a digital signal. The method includes generating, by a first reference voltage generation circuit, a first reference voltage during a first time period; providing the first reference voltage to an analog-to-digital converter; generating a comparison voltage based on the first reference voltage and the analog signal; generating, by a second reference voltage generation circuit, a second reference voltage during a second time period different from the first time period; providing the second reference voltage to the analog-to-digital converter; generating the comparison voltage based on the second reference voltage and the analog signal; and performing an analog-to-digital conversion operation based on the comparison voltage and a common voltage in at least one of the first time period and the second time period.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EMBODIMENTS

Figure 1:
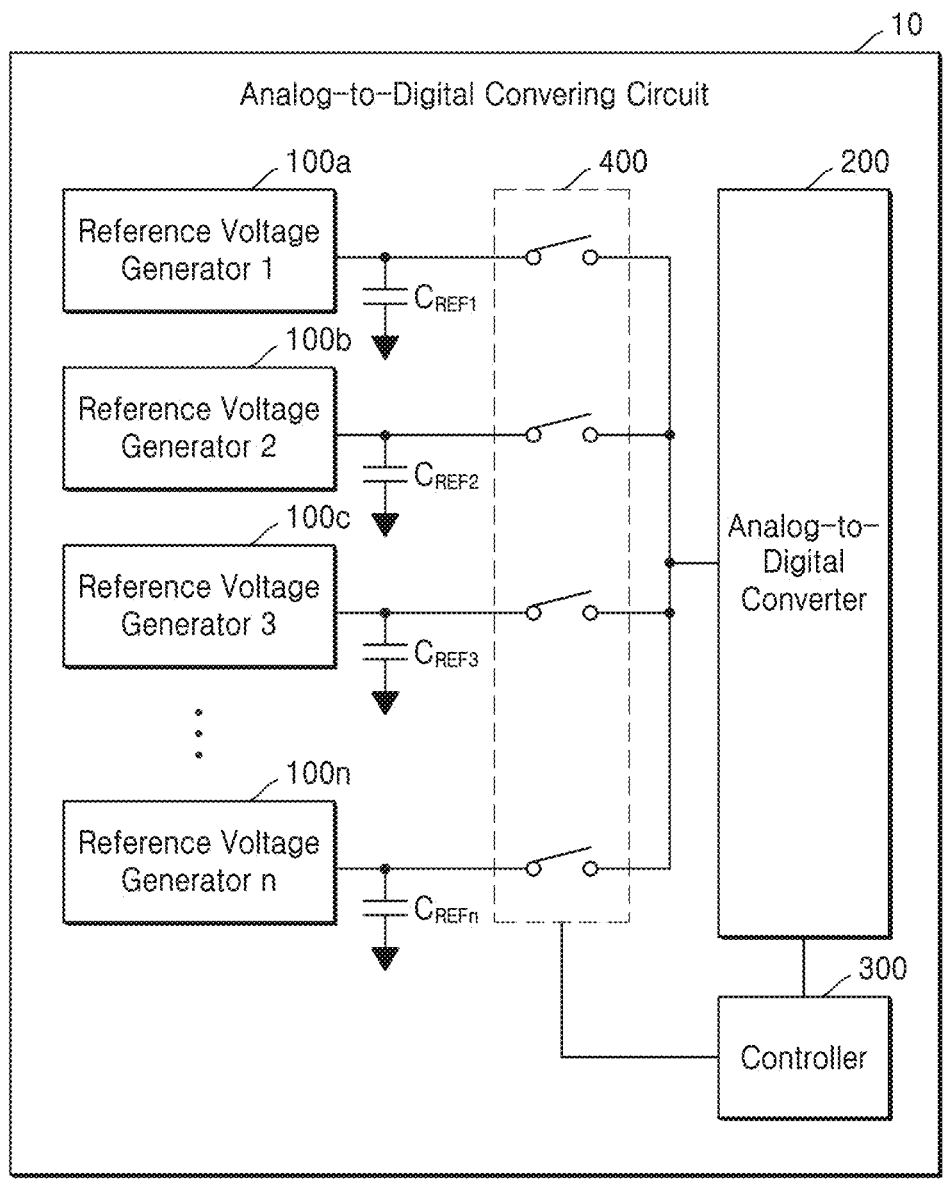
FIG. 1 is a schematic block diagram illustrating a plurality of elements included in an analog-to-digital converting circuit, according to some example embodiments.

Hereinafter, some example embodiments will be described in detail with reference to the accompanying drawings. Unless otherwise noted, like reference characters denote like elements throughout the attached drawings and written description, and thus descriptions will not be repeated.

Although the terms "first," "second," "third," etc., may be used herein to describe various elements, components, regions, layers, and/or sections, these elements, components, regions, layers, and/or sections, these terms are only used to distinguish one element, component, region, layer, or section, from another region, layer, or section. Thus, a first element, component, region, layer, or section, discussed below may be termed, for example, a fifth element, component, region, layer, or section, without departing from the scope of this disclosure.

FIG. 1 is a schematic block diagram illustrating a plurality of elements included in an analog-to-digital converting circuit 10, according to some example embodiments.

Referring to FIG. 1, the analog-to-digital converting circuit 10 may be configured to convert an analog signal (e.g., of an electronic device) into a digital signal. For example, the electronic device may be implemented as a communication device, and may be configured to communicate with another device. For example, the electronic device may be (and/or used in) a wireless communication device, a cellular phone, a personal digital assistant (PDA), a handheld device, a wireless modem, a wireless phone, a radio station, a Bluetooth device, a health care device, a wearable device, and/or the like. For example, the electronic device may be implemented as a semiconductor device so as to program or read data at the request of a host.

A plurality of first through n-th reference voltage generators 100a through 100n may receive a bandgap reference voltage and respectively generate reference voltages based on the bandgap reference voltage. The reference voltages respectively generated by the first through n-th reference voltage generators 100a through 100n may have the same voltage value as each other, but may be slightly changed, e.g., by the first through n-th decoupling capacitors $C_{REF1}$ through $C_{REFn}$ respectively included in the first through n-th reference voltage generators 100a through 100n are respectively connected to capacitors (e.g., $C_1$ through $C_4$ of FIG. 8) of the analog-to-digital converter (ADC 200). For example, when a switch, among a plurality of switches 400, corresponding to the first reference voltage generator 100a is turned on, the first decoupling capacitor $C_{REF1}$ connected to the first reference voltage generator 100a may be connected to the ADC 200, and a reference voltage may be decreased by a peak current that is supplied from the first decoupling capacitor $C_{REF1}$ to the ADC 200.

As at least one of the switches 400 is turned on, at least one of the first through n-th reference voltage generators 100a through 100n may be connected to the ADC 200, and the ADC 200 may convert an analog signal into a digital signal based on a reference voltage provided from the connected one of the first through n-th reference voltage generators 100a through 100n. According to some example embodiments, the ADC 200 may include a successive approximation regulator (SAR) ADC (not illustrated). The generating of a digital signal based on a reference voltage will be described in detail with reference to FIGS. 8 through 10.

A controller 300 may control the switches 400 to provide a reference voltage from at least one of the first through n-th reference voltage generators 100a through 100n to the ADC 200. In addition, the controller 300 may transmit a control signal to the ADC 200 to generate a comparison voltage with respect to each bit of a digital signal, wherein the digital signal is constituted of a plurality of bits. For example, the controller 300 may be and/or may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), and programmable logic unit, a microprocessor, application-specific integrated circuit (ASIC), etc. The comparison voltage may be compared with the voltage level of an analog signal such that a logic level of a corresponding bit position is determined. An example embodiment of determining a logic level according to a result of comparing a comparison voltage with the voltage level of an analog signal will be described in detail with reference to FIGS. 9 and 10.

Figure 2:
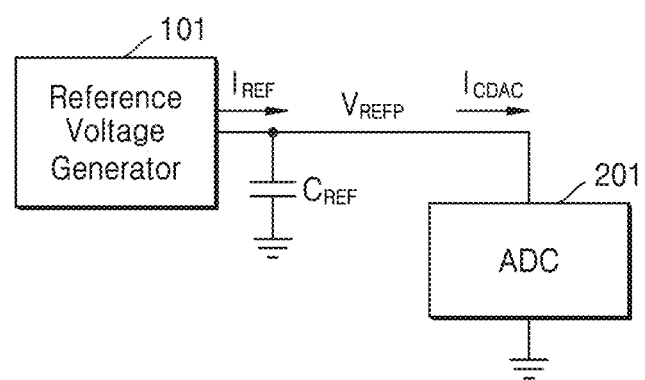
FIG. 2 is a schematic block diagram of an analog-to-digital converting circuit according to a comparative embodiment.

FIG. 2 is a schematic block diagram of an analog-to-digital converting circuit according to a comparative embodiment.

Referring to FIG. 2, the analog-to-digital converting circuit of the comparative embodiment may generate a reference voltage using a single reference voltage generator 101 and a capacitor $C_{REF}$. According to the comparative embodiment, an ADC 201 may include a SAR ADC, and the reference voltage generator 101 may include a low-dropout regulator (LDO) (not illustrated) that generates a low-power reference voltage. When the analog-to-digital converting circuit of the comparative embodiment performs a capacitive digital-to-analog converter (CDAC) switching operation, the reference voltage generator 101 may consume high power to supply a peak current, which has a high-frequency signal characteristic, to the ADC 201. In some cases, the power consumed by the reference voltage generator 101 may be greater than power consumed by the SAR ADC.

When the reference voltage generator 101 that generates a reference voltage with low power is used, a capacitor having high capacitance may be necessary to decrease a change in a voltage generated by a peak current below a threshold level. For example, the threshold level may be a voltage level corresponding to a comparison voltage of the least significant bit (LSB) of a digital signal. For example, in the case of a SAR ADC, a capacitor of about 1 nF may be necessary to secure a resolution of about 12 bits, and a 1 nF capacitor may occupy a large proportion of the area in the analog-to-digital converting circuit.

When the reference voltage generator 101 according to the comparative embodiment includes an LDO generating a reference voltage with low power, the reference voltage generator 101 has a low-speed feedback loop and may thus not supply a peak current necessary for the CDAC switching operation of the ADC 201. Accordingly, the peak current may not be supplied from the capacitor $C_{REF}$ to the ADC 201.

Figure 3:
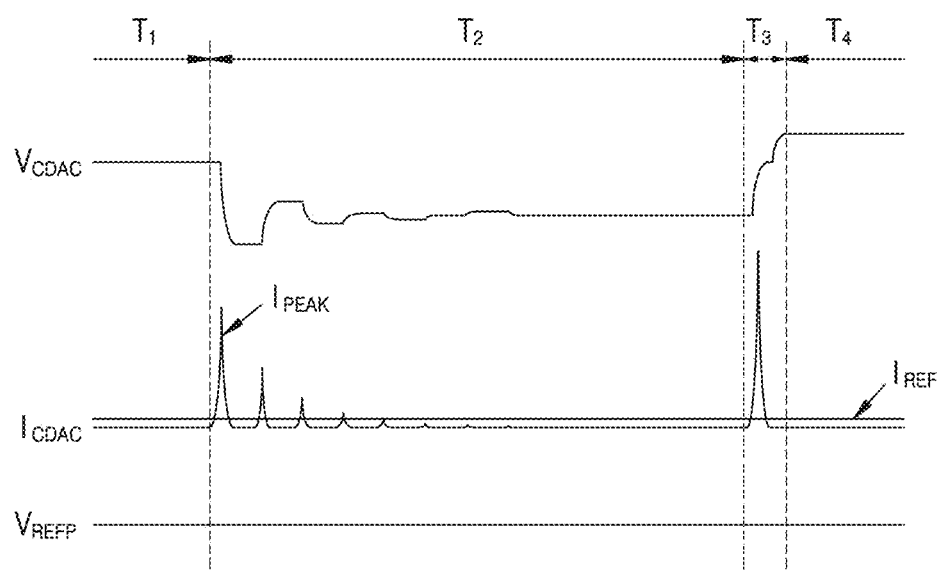
FIG. 3 is a graph of a comparison voltage generated according to a comparative embodiment, a current provided by a reference voltage generator, a peak current consumed by an analog-to-digital converting circuit, and a reference voltage.

FIG. 3 is a graph of a comparison voltage generated according to a comparative embodiment, a current provided by a reference voltage generator, a peak current consumed by an analog-to-digital converting circuit, and a reference voltage.

Referring to FIG. 2 and FIG. 3, the analog-to-digital converting circuit may perform conversion in first through fourth time periods $T_1$ through $T_4$. During the first through fourth time periods $T_1$ through $T_4$, the reference voltage generator 101 may continuously output a reference current $I_{REF}$ at a low level, which has an average of a current $I_{CDAC}$ needed by the ADC 201, and the capacitor $C_{REF}$ may be charged by the reference current $I_{REF}$.

For example, during a first time period $T_1$, the analog-to-digital converting circuit may sample an analog signal, and/or the reference voltage generator 101 may supply charges to the capacitor $C_{REF}$. After completing the sampling of the analog signal, the analog-to-digital converting circuit may perform conversion during the second time period $T_2$. The ADC 201 may perform a CDAC switching operation in correspondence to a bit position to undergo conversion in the second time period $T_2$ and receive a peak current $I_{PEAK}$ in correspondence to the CDAC switching operation. The peak current $I_{PEAK}$ may correspond to a pulse current that is generated with the change in the number of comparison voltage capacitors connected to the reference voltage generator 101 according to the CDAC switching operation. For example, the peak current $I_{PEAK}$ may be generated when the ADC 201 performs a CDAC switching operation during the second time period $T_2$, and a comparison voltage $V_{CDAC}$ (e.g., that is generated from a reference voltage $V_{REFP}$ according to the CDAC switching operation) may be updated.

The analog-to-digital converting circuit that has completed the conversion according to the CDAC switching operation may reset the comparison voltage $V_{CDAC}$ by performing a CDAC reset operation during the third time period $T_3$. The reset of the comparison voltage $V_{CDAC}$ may include an operation of resetting a digital input voltage of the comparison voltage $V_{CDAC}$ to an initial value to convert a subsequently sampled signal into a digital signal. After the CDAC reset, the analog-to-digital converting circuit may perform a sampling operation on a subsequent analog signal during the fourth time period $T_4$.

At this time, the comparison voltage $V_{CDAC}$ may have been generated from the reference voltage $V_{REFP}$ through CDAC switching. It may be ideal that the reference voltage generator 101 generates the reference voltage $V_{REFP}$ at a constant level such that a digital signal is accurately generated according to a result of comparing the comparison voltage $V_{CDAC}$ with the voltage level of a sampled signal.

However, though not illustrated in FIG. 3, the reference voltage $V_{REFP}$ may be changed, e.g., by the amount of charges drained out of the capacitor $C_{REF}$, due to the expression of the peak current $I_{PEAK}$. The change in the reference voltage $V_{REFP}$ will be described with reference to FIG. 4 below.

Figure 4:
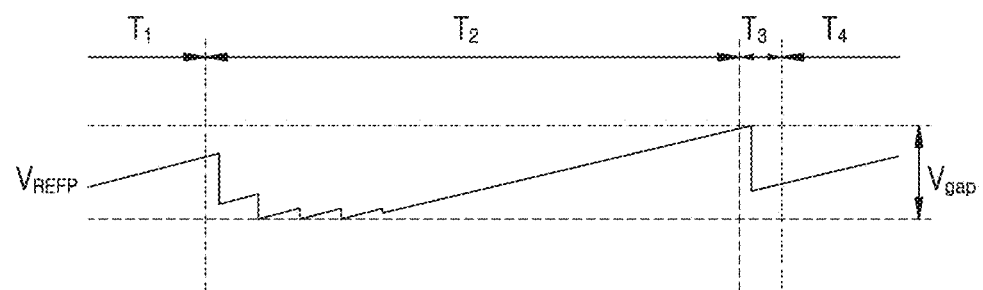
FIG. 4 is a graph showing a change in the reference voltage, which is generated according to the comparative embodiment of FIG. 3, with respect to a peak current.

FIG. 4 is a graph showing a change in the reference voltage $V_{REFP}$, which is generated according to the comparative embodiment of FIG. 3, with respect to the peak current $I_{PEAK}$.

Referring to FIG. 4, each time the peak current $I_{PEAK}$ is generated, the amount of charge stored in the capacitor $C_{REF}$ may be decreased, e.g., by the peak current $I_{PEAK}$, and accordingly, the reference voltage $V_{REFP}$ may be decreased. When there is no peak current $I_{PEAK}$, the reference voltage generator 101 may output an average of the reference current $I_{CDAC}$, which is used for the CDAC switching operation, as the reference current $I_{REF}$, and accordingly, the reference voltage $V_{REFP}$ may increase by a slope of the reference current $I_{REF}$/the capacitance of the capacitor $C_{REF}$. Such a repetition of the decrease and increase of the reference voltage $V_{REFP}$ may deteriorate the performance of the ADC 201. Furthermore, the capacitor $C_{REF}$ may need to have and/or maintain a high capacitance to maintain the amplitude change of the reference voltage $V_{REFP}$ below a threshold voltage level. For example, when the reference voltage $V_{REFP}$ is generated using a single reference voltage generator (e.g., the reference voltage generator 101) and the capacitor $C_{REF}$ (e.g., according to the comparative embodiment) the capacitor $C_{REF}$ needs to have high capacitance, and accordingly, a circuit for generating the reference voltage $V_{REFP}$ needs to be assigned a large area in the analog-to-digital converting circuit.

Contrarily, an analog-to-digital converting circuit according to some example embodiments may be provided with charges from a capacitor, among a plurality of capacitors, corresponding to a conversion period and may, thus, include capacitors having lower capacitance, compared to the comparative embodiment, and accordingly, the space efficiency of a circuit configuration may be improved and/or optimized.

Figure 5:
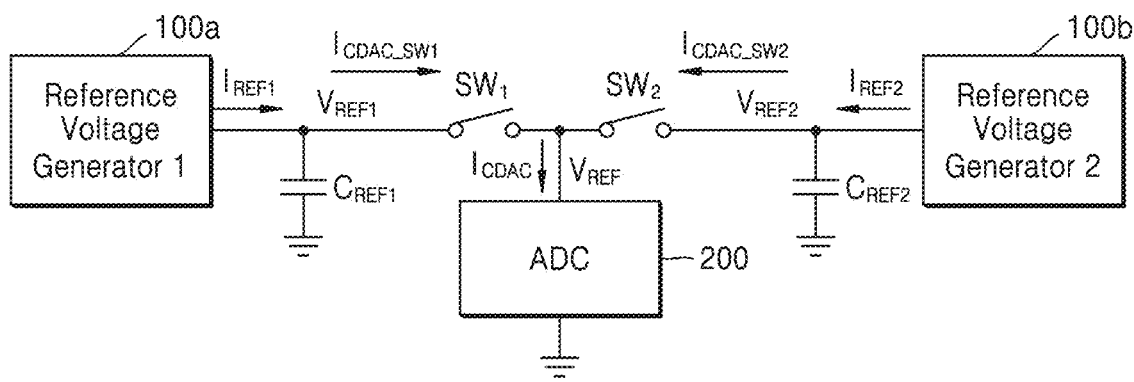
FIG. 5 is a diagram of the configuration of an analog-to-digital converting circuit including a plurality of reference voltage generators, according to some example embodiments.

FIG. 5 is a diagram of the configuration of an analog-to-digital converting circuit 10 including a plurality of reference voltage generators, according to some example embodiments.

Referring to FIG. 5, the analog-to-digital converting circuit 10 may include a first reference voltage generation circuit and a second reference voltage generation circuit. Each of the first and second reference voltage generation circuits may include a paired reference voltage generator (100a and 100b) and decoupling capacitor ($C_{ref1}$ and $C_{ref2}$). For example, the first reference voltage generation circuit may include the first reference voltage generator 100a and the first decoupling capacitor $C_{REF1}$, and the second reference voltage generation circuit may include the second reference voltage generator 100b and the second decoupling capacitor $C_{REF2}$. For example, each of the first and second reference voltage generators 100a and 100b may include an LDO that generates a reference voltage with low power. The circuit diagram of each of the first and second reference voltage generators 100a and 100b will be described in detail with reference to FIG. 6 below.

Each of the first and second reference voltage generation circuits may provide a reference voltage to the ADC 200, e.g., according to the activation and/or deactivation of a switch (e.g., a first switch $SW_1$ and/or a second switch $SW_2$) connected to the first or second reference voltage generation circuit. For example, when a first switch $SW_1$ is activated in a first conversion period, a first reference voltage $V_{REF1}$, generated by the first reference voltage generation circuit, may be provided to the ADC 200 and/or when a second switch $SW_2$ is activated in a second conversion period, a second reference voltage $V_{REF2}$ generated by the second reference voltage generation circuit may be provided to the ADC 200.

The ADC 200 may convert an input analog signal into a digital signal and may perform a sampling operation on the analog signal before the conversion operation. For example, in some example embodiments, the ADC 200 may include an SAR ADC and may generate a digital signal with respect to a sampled signal based on a result of comparing the sampled signal with a comparison voltage generated using a reference voltage. The SAR ADC may change a comparison voltage for each bit in the digital signal and compare the sampled signal with the comparison voltage. An example conversion operation of the SAR ADC will be described below with reference to FIGS. 7 through 9.

Each switch connected to a reference voltage generation circuit may be controlled by a controller (e.g., the controller 300 in FIG. 1). The on or off state of each switch may be updated at the transition of a predetermined (and/or otherwise devised) conversion period of an entire conversion period. For example, the first switch $SW_1$ may be activated and a second switch $SW_2$ may be deactivated in a first conversion period, whereas the first switch $SW_1$ may be deactivated and the second switch $SW_2$ may be activated in a second conversion period. An example embodiment in which the entire conversion period is divided into the first conversion period and the second conversion period will be described with reference to FIGS. 10 through 12 below.

Figure 6:
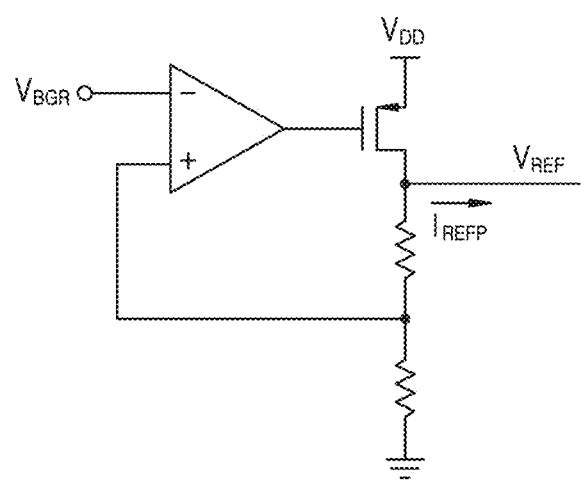
FIG. 6 is a circuit diagram of a reference voltage generator according to some example embodiments.

FIG. 6 is a circuit diagram of the reference voltage generator 100a and 100b according to the embodiment of FIG. 5.

Referring to FIG. 6, the reference voltage generators 100a and 100b may externally receive a bandgap reference voltage $V_{BGR}$ and generate a reference current $I_{REFP}$ from a supply voltage $V_{DD}$ according to a result of comparing the bandgap reference voltage $V_{BGR}$ with a reference voltage $V_{REF}$ that has been fed back. The reference voltage generator may include a regulator that reliably generates a constant voltage and/or an LDO that generates the reference voltage $V_{REF}$ with low power.

The bandgap reference voltage $V_{BGR}$ may include a direct current (DC) voltage that is generated at a predetermined (and/or otherwise set) voltage level outside the analog-to-digital converting circuit. An error amplifier included in the reference voltage generator may compare the bandgap reference voltage $V_{BGR}$ with a feedback voltage. The feedback voltage may be determined by resistors connected to an end of the error amplifier. When the feedback voltage is lower than the bandgap reference voltage $V_{BGR}$, a transistor may be activated, and the reference current $I_{REFP}$ may be output from the supply voltage $V_{DD}$ connected to an end of the activated transistor. The reference voltage generator may generate and output the reference voltage $V_{REF}$ according to the reference current $I_{REFP}$.

Although the embodiment of FIG. 6 shows a circuit diagram of an LDO that generates the reference voltage $V_{REF}$ with low power, the example embodiments are not limited thereto. For example, the embodiments may include any embodiments, in which the peak current $I_{PEAK}$ may be supplied from the first or second decoupling capacitor $C_{REF1}$ or $C_{REF2}$ in FIG. 5 to the ADC 200, and/or the reference voltage $V_{REF}$ may be generated by a buffer and/or the like.

Figure 7:
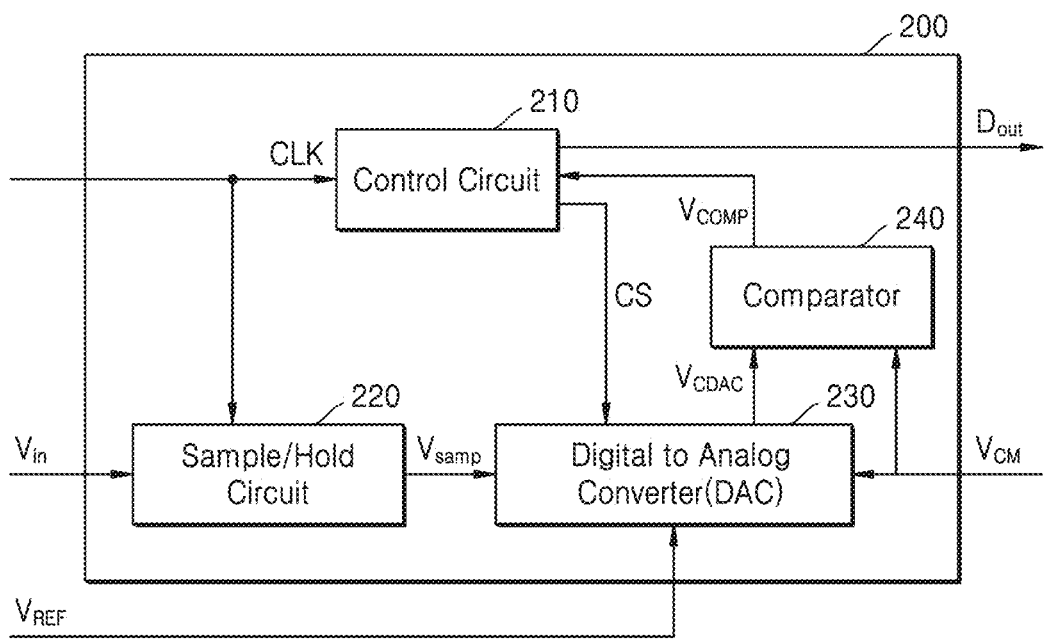
FIG. 7 is a block diagram of the configuration of an analog-to-digital converter (ADC) according to some example embodiments.
Figure 8:
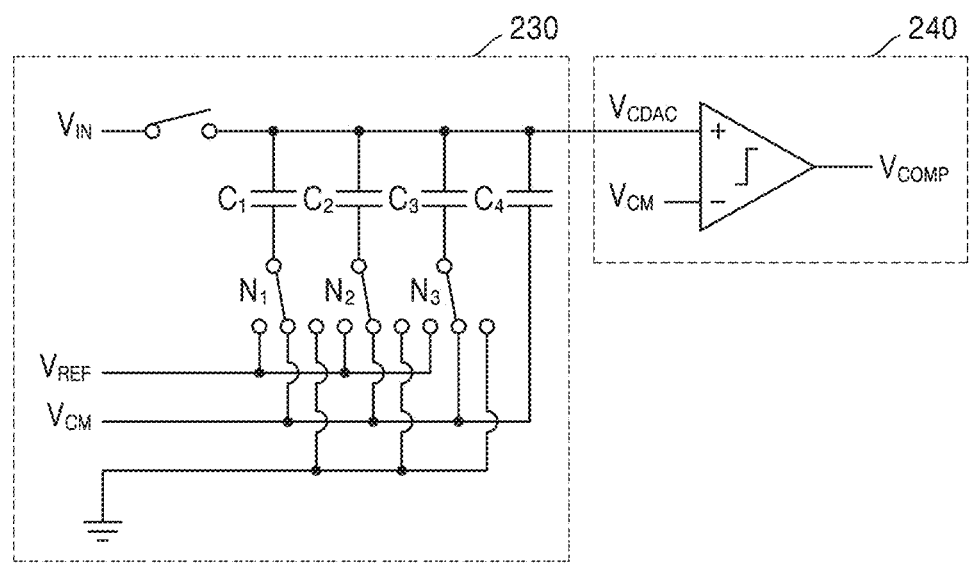
FIG. 8 is a circuit diagram illustrating a digital-to-analog converter (DAC) and a comparator of an ADC, according to some example embodiments.
Figure 9:
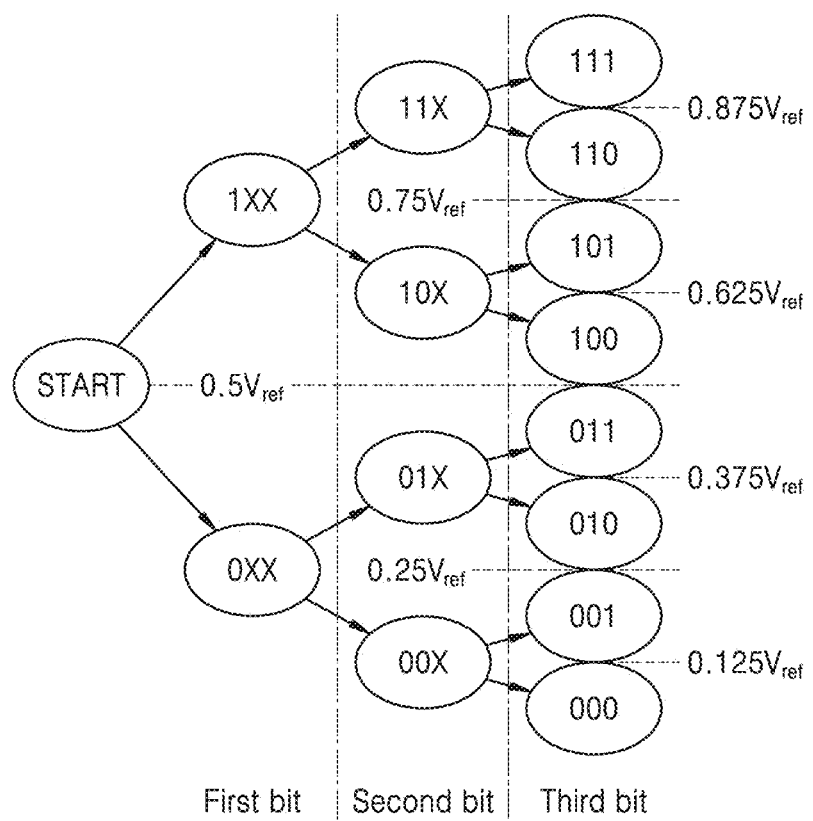
FIG. 9 is a graph showing data of a digital signal generated by comparing a comparison voltage with the voltage level of an input signal.

FIG. 7 is a block diagram of the configuration of the ADC 200 according to some example embodiment. FIG. 8 is a circuit diagram illustrating the DAC 230 and the comparator 240 of the ADC 200, according to some example embodiments. FIG. 9 is a graph showing data of a digital signal generated by comparing a comparison voltage with the voltage level of the input signal $V_{in}$.

Referring to FIG. 7, the ADC 200 may include a control circuit 210, a sample/hold circuit 220, a DAC 230, and a comparator 240. The ADC 200 may externally receive a clock signal CLK and perform a conversion operation on an analog signal in synchronization with the clock signal CLK.

For example, the sample/hold circuit 220 may receive the clock signal CLK and an input signal $V_{in}$ corresponding to an analog signal and perform a sampling operation. The sample/hold circuit 220 may generate a sampled signal from the input signal $V_{in}$ based on the clock signal CLK and output the sampled signal $V_{samp}$ to the DAC 230. The control circuit 210 may provide a control signal CS to the DAC 230, and the DAC 230 may generate the comparison voltage $V_{CDAC}$ in response to the control signal CS.

Referring to FIGS. 7 and 8, the DAC 230 may generate the comparison voltage $V_{CDAC}$ for each bit to be generated for a digital signal, which may be comprise a plurality of bits, based on a common voltage $V_{CDAC}$ and the reference voltage $V_{REF}$ received from the reference voltage generator. The comparison voltage $V_{CDAC}$ may have a voltage level obtained by adding and/or subtracting the voltage level of the reference voltage $V_{REF}$ or the common voltage $V_{CM}$ to (and/or from) the voltage level of the sampled signal received from the sample/hold circuit 220. An example embodiment in which the DAC 230 generates the comparison voltage $V_{CDAC}$ for each bit will be described with reference to FIGS. 8 and 9 below.

The comparator 240 may compare the comparison voltage $V_{CDAC}$ generated by the DAC 230 with the common voltage $V_{CM}$ and generate a comparison result voltage $V_{COMP}$. For example, the DAC 230 may generate the comparison voltage $V_{CDAC}$ for determining the logic level of the most significant bit (MSB), and the comparator 240 may compare the common voltage $V_{CM}$ with the comparison voltage $V_{CDAC}$. When the comparison voltage $V_{CDAC}$ is higher than or equal to the common voltage $V_{CM}$, the comparator 240 may output the comparison result voltage $V_{COMP}$ at a logic high level. When the comparison voltage $V_{CDAC}$ is lower than the common voltage $V_{CM}$, the comparator 240 may output the comparison result voltage $V_{COMP}$ at a logic low level.

The comparator 240 may provide data of a logic level determined for each bit to the control circuit 210. The control circuit 210 may generate the control signal CS for generating the comparison voltage $V_{CDAC}$ for a subsequent bit, according to the logic level. For example, when data of a logic high level is output in correspondence to the MSB, the control circuit 210 may determine a voltage, which is lower than a comparison voltage corresponding to the MSB, as a comparison voltage corresponding to a subsequent bit. When data of a logic low level is output in correspondence to the MSB, the control circuit 210 may determine a voltage, which is higher than a comparison voltage corresponding to the MSB, as a comparison voltage corresponding to a subsequent bit. For example, the voltage level of the comparison voltage $V_{CDAC}$ corresponding to a lower bit may differ based on the logic level of an upper bit.

The comparator 240 may provide the comparison result voltage $V_{COMP}$ corresponding to each of bits from the MSB to the LSB to the control circuit 210, and the control circuit 210 may generate a digital output signal $D_{out}$ based on the logic level of the comparison result voltage $V_{COMP}$ corresponding to each bit. For example, the digital output signal $D_{out}$ generated by the control circuit 210 may include data information constituted of a series of bits.

FIG. 8 shows an example embodiment of the DAC 230, which receives the input signal $V_{in}$ in a single-ended mode and performs digital-to-analog conversion, and the comparator 240; however, the DAC 230 is not limited to the example of FIG. 8 but may include any embodiment that may generate a plurality of comparison voltages $V_{CDAC}$ under the control of a switch array and compare one of the comparison voltages $V_{CDAC}$ with the common voltage $V_{CM}$. For example, DAC 230 is not limited to the number of comparison voltage capacitors (e.g., $C_1$ through $C_4$) and/or comparison voltage switches (N1 through N3) illustrated in FIG. 8. Additionally, the DAC 230 may receive the sampled signal $V_{samp}$ in a differential mode and perform digital-to-analog conversion. Hereinafter, an example embodiment of generating a 3-bit digital signal from an analog signal will be described with reference to FIGS. 8 and 9.

Referring to FIG. 8, the DAC 230 may include a capacitor array, which includes a plurality of comparison voltage capacitors (e.g., first through fourth comparison voltage capacitors $C_1$ through $C_4$) and a switch array, which includes a plurality of comparison voltage switches (e.g., first through third comparison voltage switches $N_1$ through $N_3$). Some of the comparison voltage capacitors of the capacitor array may be respectively connected to the comparison voltage switches of the switch array. For example, the first through third comparison voltage capacitors $C_1$ through $C_3$ may be respectively connected to the first through third comparison voltage switches $N_1$ through $N_3$.

Each of the first through third comparison voltage capacitors $C_1$ through $C_3$ of the capacitor array may generate data corresponding to one of first through third bits, and the fourth comparison voltage capacitor $C_4$ may correspond to a dummy capacitor. For example, the first bit may correspond to the MSB of a data signal, and the third bit may correspond to the LSB of the data signal.

When the DAC 230 performs a conversion operation to generate the first bit, the first comparison voltage switch $N_1$ connected to the first comparison voltage capacitor $C_1$ may be switched. When the DAC 230 performs a conversion operation to generate the second bit, the second comparison voltage switch $N_2$ connected to the second comparison voltage capacitor $C_2$ may be switched. When the DAC 230 performs a conversion operation to generate the third bit, the third comparison voltage switch $N_3$ connected to the third comparison voltage capacitor $C_3$ may be switched.

The capacitance of the first comparison voltage capacitor $C_1$ that generates the data of the MSB may be twice the capacitance of the second comparison voltage capacitor $C_2$ that generates the data of a lower bit next to the MSB. The capacitance of the second comparison voltage capacitor $C_2$ may be twice the capacitance of the third comparison voltage capacitor $C_3$ that generates the data of the LSB. In some example embodiments, the capacitance of the third comparison voltage capacitor $C_3$ may be the same as the capacitance of the fourth comparison voltage capacitor $C_4$.

The DAC 230 may, for example, generate the comparison voltage $V_{CDAC}$ corresponding to a bit to be converted using a CDAC switching operation. Before the data of the MSB is generated, the first through third comparison voltage switches $N_1$ through $N_3$ may be connected to a node of the common voltage $V_{CM}$, and the comparison voltage $V_{CDAC}$ may have the same value as the sampled signal $V_{samp}$. The amount of charges stored in the first through fourth comparison voltage capacitors $C_1$ through $C_4$ may be defined as Equation 1.

$$Q=(C_1+C_2+C_3+C_4)*(V_{samp}-V_{CM}) \quad \text{[Equation 1]}$$

Here, when $V_{CM}$ is $V_{REF}/2$, the comparator 240 may generate MSB data by comparing the level of the sampled signal $V_{samp}$ with the level of the common voltage $V_{CM}$. The negative (−) terminal of the comparator 240 may receive the common voltage $V_{CM}$, and the positive (+) terminal thereof may be connected to an output node of the DAC 230, and accordingly, the logic level of the comparison result voltage $V_{COMP}$ output from the comparator 240 may be determined according to the sign of the voltage level difference between the comparison voltage $V_{CDAC}$ and the common voltage $V_{CM}$. For example, when the logic level of the comparison result voltage $V_{COMP}$ is a logic high level, the MSB data may be "1," And when the logic level of the comparison result voltage $V_{COMP}$ is a logic low level, the MSB data may be "0."

According to some example embodiments, the DAC 230 may perform a different switching operation on a lower bit according to the logic level of an upper bit. For example, the DAC 230 may change the switching operation of the switch array according to the logic level of the MSB. When the logic level of the MSB is a logic low level, the first comparison voltage switch $N_1$ may be switched to a node connected to the reference voltage $V_{REF}$. When the logic level of the MSB is a logic high level, the first comparison voltage switch $N_1$ may be switched to a ground node.

Accordingly, when the sampled signal $V_{samp}$ is lower than the common voltage $V_{CM}$, the comparison result voltage $V_{COMP}$ may have low-level data, and the control circuit 210 in FIG. 7 may apply the control signal CS to the DAC 230 to connect the first comparison voltage switch $N_1$ to the node connected to the reference voltage $V_{REF}$ and maintain the connection between each of the second and third comparison voltage switches $N_2$ and $N_3$ and a node connected to the common voltage $V_{CM}$. For example, the amounts of charges respectively stored in the first through fourth comparison voltage capacitors $C_1$ through $C_4$ may have the relationship defined as Equation 2 to satisfy charge conservation.

$$(C_1+C_2+C_3+C_4)*(V_{samp}-V_{CM})=C_1*(V_{CDAC}-V_{REF})+(C_2+C_3+C_4)*(V_{CDAC}-V_{CM}) \quad \text{[Equation 2]}$$

Here, when the capacitance of the first comparison voltage capacitor $C_1$ is $4*C$, the capacitance of the second comparison voltage capacitor $C_2$ is $2*C$, and the capacitance of each of the third and fourth comparison voltage capacitors $C_3$ and $C_4$ is C; the comparison voltage $V_{CDAC}$ satisfying Equation 2 may be given Equation 3.

$$V_{CDAC}=V_{samp}+\tfrac{1}{4}*V_{REF} \quad \text{[Equation 3]}$$

To generate the data of a bit following the MSB, the comparator 240 may determine the logic level of the comparison result voltage $V_{COMP}$ (e.g., by comparing the voltage level of the common voltage $V_{CM}$ with the voltage level of the comparison voltage $V_{CDAC}$).

Referring to Equation 3, and the relationship between the reference voltage $V_{REF}$ and the common voltage $V_{CM}$, when the voltage level of the comparison voltage $V_{CDAC}$ is at least a half of the voltage reference (e.g., $(\tfrac{1}{2})*V_{REF}$), the comparator 240 may output a logic high level for the comparison result voltage $V_{COMP}$. When the voltage level of the comparison voltage $V_{CDAC}$ is lower than $(\tfrac{1}{2})*V_{REF}$, the comparator 240 may output a logic low level for the comparison result voltage $V_{COMP}$.

When the data of a bit following the MSB corresponds to a logic low level, the second comparison voltage switch $N_2$ may be switched to the node connected to the reference voltage $V_{REF}$. For example, the voltage level of the comparison voltage $V_{CDAC}$ satisfying charge conservation may be defined as Equation 4.

$$V_{CDAC} = V_{samp} + \tfrac{1}{4} * V_{REF} + \tfrac{1}{8} * V_{REF} \quad \text{[Equation 4]}$$

However, when the data of the bit following the MSB corresponds to a logic high level, the second comparison voltage switch $N_2$ may be switched to the ground node. For example, the voltage level of the comparison voltage $V_{CDAC}$ satisfying charge conservation may be defined as Equation 5.

$$V_{CDAC} = V_{samp} + \tfrac{1}{4} * V_{REF} - \tfrac{1}{8} * V_{REF} \quad \text{[Equation 5]}$$

For example, referring to FIG. 9, the DAC 230 may update the comparison voltage $V_{CDAC}$ for each of bits from the MSB to the LSB through CDAC switching while performing a conversion operation on a sampled signal and determine the data of a digital signal according to a result of comparing the comparison voltage $V_{CDAC}$ with the common voltage $V_{CM}$.

When the DAC 230 sequentially performs conversion operations respectively for the bits from the MSB to the LSB, the difference between successive comparison voltages $V_{CDAC}$ may decrease. For example, a comparison voltage, which has a difference of $0.25 V_{REF}$ from a comparison voltage generated when a conversion operation is performed for the first bit, may be generated when a conversion operation is performed for the second bit; and a comparison voltage, which has a difference of $0.125 V_{REF}$ from the comparison voltage generated when the conversion operation is performed for the second bit, may be generated when a conversion operation is performed for the third bit. In other words, when a conversion operation is performed for a lower bit, a sophisticated voltage shift may be necessary for accurate comparison.

Figure 10:
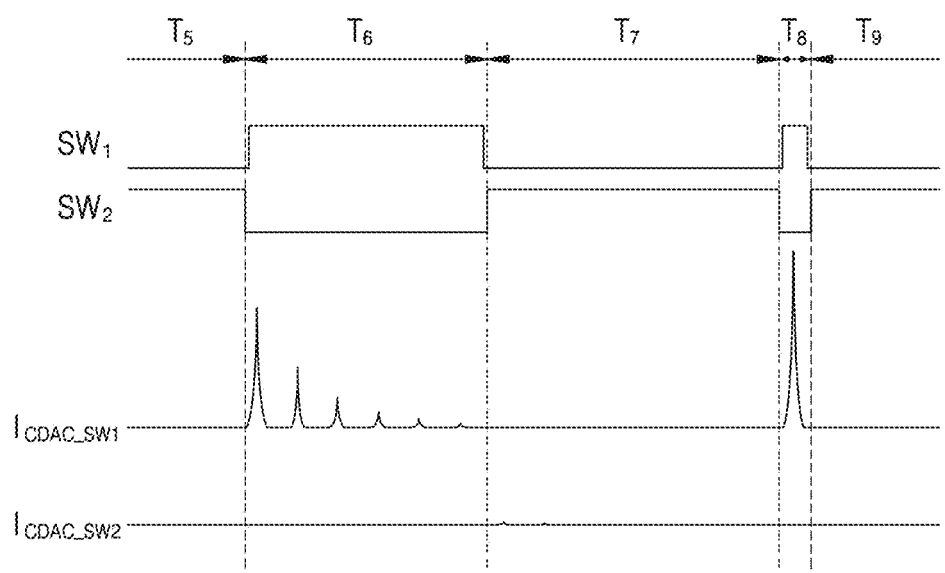
FIG. 10 is a graph showing switch signals applied to a plurality of switches and a comparison current provided to an ADC, according to some example embodiments.

FIG. 10 is a graph showing switch signals applied to a plurality of switches and a comparison current provided to an ADC, according to some example embodiments.

Referring to FIGS. 5 and 10, the first switch $SW_1$ connecting the first reference voltage generation circuit to the ADC 200 may be activated in a different period than the second switch $SW_2$ connecting the second reference voltage generation circuit to the ADC 200. For example, the first switch $SW_1$ may be activated while the second switch $SW_2$ is deactivated in the first conversion period of an entire conversion period; and the first switch $SW_1$ may be deactivated while the second switch $SW_2$ is activated in the second conversion period of the entire conversion period.

The first conversion period (in which the first switch $SW_1$ is activated) may correspond to a time period, in which a significant voltage shift is necessary in a comparison voltage each time when a CDAC switching operation is performed. The second conversion period (in which the second switch $SW_2$ is activated) may correspond to a time period, in which a smaller voltage shift than in the first conversion period is used in a comparison voltage each time when a CDAC switching operation is performed.

For example, in the first conversion period, there may be a great change in the reference voltage $V_{REF}$ because a large peak current is provided from the first decoupling capacitor $C_{REF1}$ of the first reference voltage generation circuit to the ADC 200; and, in the second conversion period, there may be a small change in the reference voltage $V_{REF}$ because a small peak current is provided from the second decoupling capacitor $C_{REF2}$ of the second reference voltage generation circuit to the ADC 200. For example, a sixth time period $T_6$ in FIG. 10 may correspond to the first conversion period, and a seventh time period $T_7$ in FIG. 10 may correspond to the second conversion period.

In addition, because a large peak current may be output from a reference voltage generation circuit during an eighth time period $T_8$ (in which the analog-to-digital converting circuit 10 resets the DAC 230) the first switch $SW_1$ may be activated such that the first reference voltage generation circuit is connected to the ADC 200. However, a large peak current does not need to be output during fifth and ninth time periods $T_5$ and $T_9$, in which a sampling operation is performed, and therefore, the second switch $SW_2$ may be activated.

Figure 11:
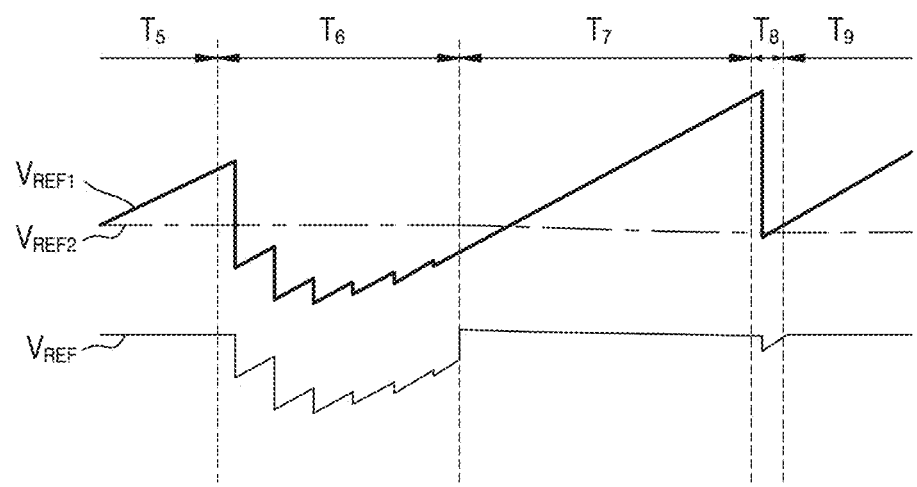
FIG. 11 is a graph showing a plurality of reference voltages generated by an analog-to-digital converting circuit and reference voltages applied to an ADC, according to some example embodiments.

FIG. 11 is a graph showing a plurality of reference voltages $V_{REF}$ generated by the analog-to-digital converting circuit 10 and reference voltages $V_{REF}$ applied to the ADC 200, according to some example embodiments.

Referring to FIGS. 10 and 11, a first reference voltage $V_{REF1}$ generated by the first reference voltage generation circuit may be applied to the ADC 200 during the sixth time period $T_6$, and a second reference voltage $V_{REF2}$ generated by the second reference voltage generation circuit may be applied to the ADC 200 during the seventh time period $T_7$.

The reference voltage may be a DC voltage, but the reference voltage $V_{REF}$ is enlarged in the direction of the voltage scale in FIG. 11 to help explain a fluctuation in the reference voltage $V_{REF}$. When the fluctuation in the reference voltage $V_{REF}$ increases due to a peak current, an incorrect comparison voltage may be generated, causing an error in a result of analog-to-digital conversion. To correct the error, the analog-to-digital converting circuit 10 may perform error correction using redundancy.

For example, referring to FIG. 11, the reference voltage $V_{REF}$ generated in the sixth time period $T_6$ may have a lower voltage level than the reference voltage $V_{REF}$ generated in the seventh time period $T_7$. At this time, the analog-to-digital converting circuit 10 may generate an incorrect comparison voltage based on a difference between the minimum of the reference voltage $V_{REF}$ generated in the sixth time period $T_6$ and the maximum of the reference voltage $V_{REF}$ generated in the seventh time period $T_7$.

The error correction using redundancy may include, e.g., additionally performing a conversion operation for a dummy bit. For example, between the first conversion period and the second conversion period, a conversion operation may be performed for a dummy bit to correct an error occurring in the first conversion period. According to some example embodiments, the redundancy error correction may not be limitedly performed only between the first conversion period and the second conversion period but be performed, e.g., in any period in which a second conversion operation is performed.

Figure 12:
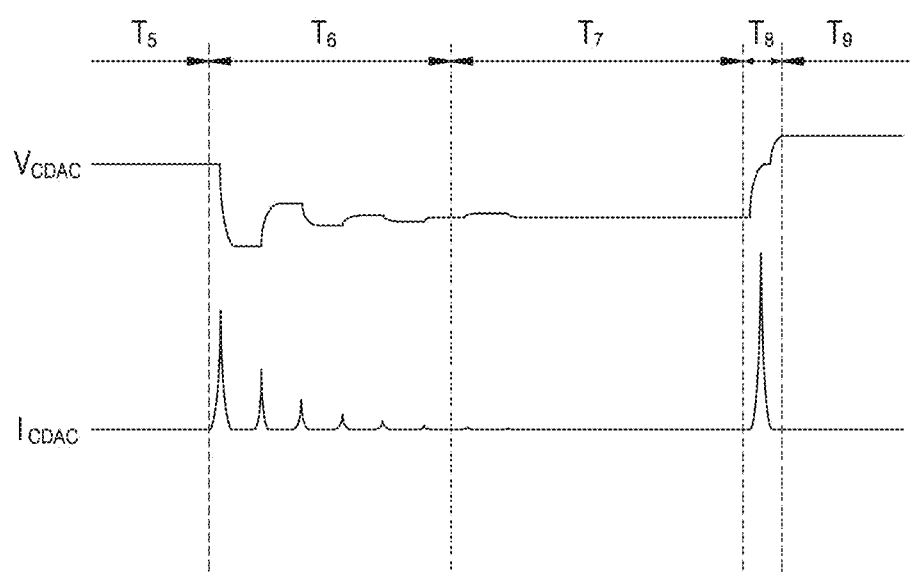
FIG. 12 is a graph showing a comparison voltage and a comparison current, which are generated by an ADC, according to FIGS. 10 and 11.

FIG. 12 is a graph showing the comparison voltage $V_{CDAC}$ and the comparison current $I_{CDAC}$, which are generated by the ADC 200, according to FIGS. 10 and 11.

Referring to FIG. 12, a peak current used by the DAC 230 during the sixth time period $T_6$ may be provided from the first reference voltage generation circuit to the ADC 200, and a peak current needed by the DAC 230 during the seventh time period $T_7$ may be provided from the second reference voltage generation circuit to the ADC 200. Referring to FIGS. 5, 10 and 12, the peak current generated by the first reference voltage generation circuit in FIG. 10 may correspond to a peak current in the sixth time period $T_6$ in FIG. 12, and the peak current generated by the second reference voltage generation circuit FIG. 10 may correspond to a peak current in the seventh time period $T_7$ in FIG. 12.

Each time when a CDAC switching operation is performed in the sixth time period $T_6$ and the seventh time period $T_7$, the comparison voltage $V_{CDAC}$ may be decreased or increased by a peak current consumed by a CDAC, and the peak current may be applied to the ADC 200. After conversion is completed, the first reference voltage generation circuit may receive the peak current in the eighth time period $T_8$ so that a CDAC reset operation may be performed.

According to some example embodiments, the analog-to-digital converting circuit 10 may generate the reference voltage $V_{REF}$ using different reference voltage generation circuits in the first conversion period, in which a change in the comparison voltage $V_{CDAC}$ and a peak current are relatively great, and in the second conversion period, in which the change in the comparison voltage $V_{CDAC}$ and the peak current are relatively small, thereby generating the reference voltage $V_{REF}$ using lower capacitance of capacitors, compared to the comparative embodiment. In addition, because a small peak current is necessary in the second conversion period, an LDO of the second reference voltage generation circuit may generate the reference voltage $V_{REF}$ with lower power, compared to the comparative embodiment.

Although it has been described above that the first and second reference voltage generation circuits alternately provide the reference voltage $V_{REF}$ to the ADC 200 in the analog-to-digital converting circuit 10, the analog-to-digital converting circuit 10 is not limited thereto. The reference voltage $V_{REF}$ may be provided to the ADC 200 using at least three reference voltage generation circuits.

Figure 13:
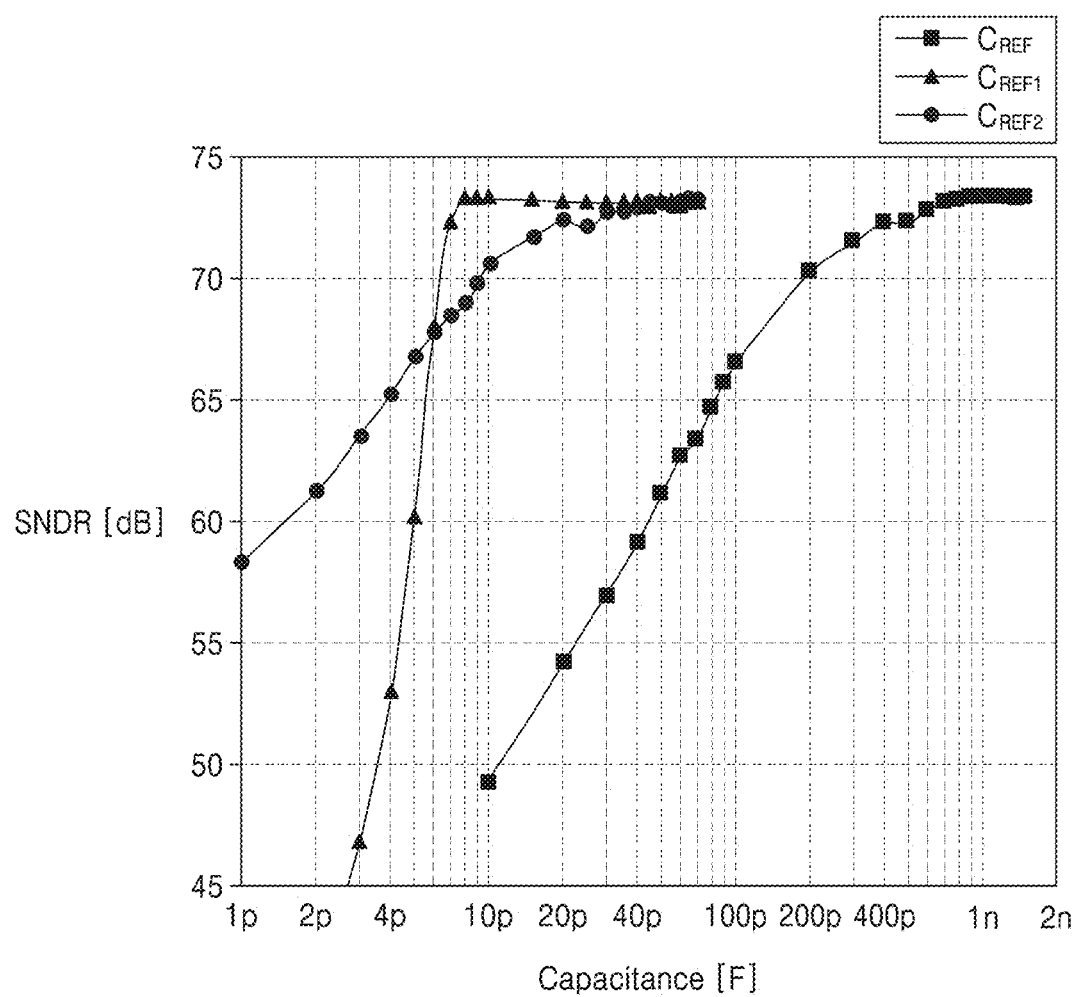
FIG. 13 is a graph showing the results of simulating a signal-to-noise and distortion ratio (SNDR) of an ADC with respect to the capacitance of decoupling capacitors used in an example embodiment and a comparative embodiment.

FIG. 13 is a graph showing the results of simulating a signal-to-noise and distortion ratio (SNDR) of an ADC with respect to the capacitance of decoupling capacitors used in a present embodiment and a comparative embodiment.

Referring to FIG. 13, as the capacitance of the decoupling capacitor $C_{REF}$ used in the comparative embodiment increases, the SNDR indicating the performance of the analog-to-digital converting circuit 10 also increases. This will be understood from the description of FIG. 4 that a change in the reference voltage $V_{REF}$ decreases as the capacitance of the decoupling capacitor $C_{REF}$ increases.

Similarly, as the capacitance of a decoupling capacitor used in the present embodiment increases, the SNDR may also increase. However, according to the present embodiment, reference voltage generation circuits may alternately generate the reference voltage $V_{REF}$ in a plurality of conversion periods, into which an entire conversion period is divided, and therefore, the capacitance of a decoupling capacitor may be less compared to the comparative embodiment.

For example, though the decoupling capacitor $C_{REF}$ of the comparative embodiment needs to have a capacitance of at least 900 pF not to allow a change in the reference voltage $V_{REF}$ to influence the SNDR, according to the present embodiment, when the first decoupling capacitor $C_{REF1}$ has a capacitance of at least 8 pF and the second decoupling capacitor $C_{REF2}$ has a capacitance of at least 40 pF, the SNDR does not deteriorate. Thus, the present embodiment may secure similar SNDR performance to the comparative embodiment just by using a capacitor having about 1/19 of the capacitance of the comparative embodiment, and accordingly, the area of the analog-to-digital converting circuit 10 may be significantly reduced.

Figure 14:
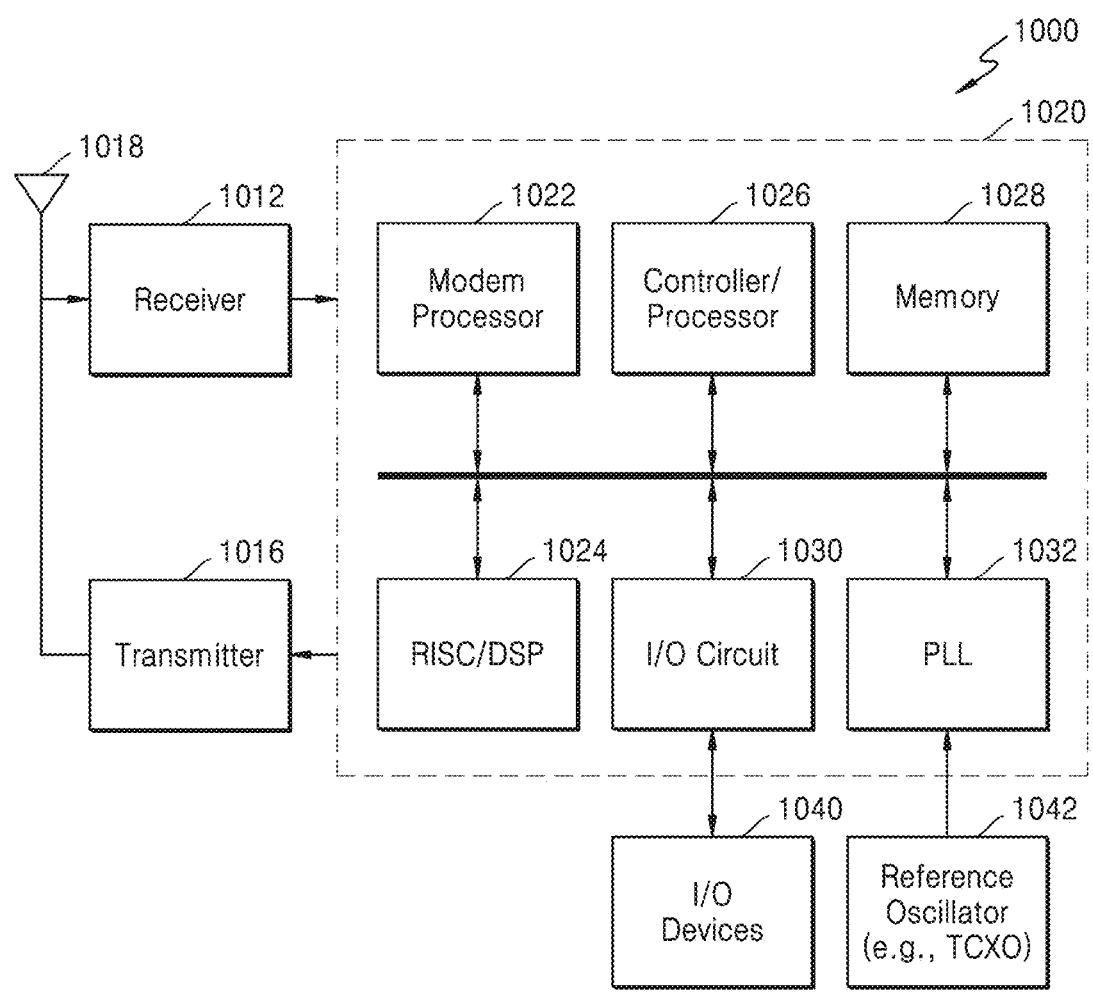
FIG. 14 is a block diagram of a communication device according to some example embodiments.

FIG. 14 is a block diagram of a communication device according to an example embodiment.

Referring to FIG. 14, a communication device 1000 may include a receiver 1012, a transmitter 1016, a communication module 1020, an antenna 1018, an external input/output (I/O) device 1040, and a reference oscillator 1042. The receiver 1012 may include the analog-to-digital converting circuit 10 performing an analog-to-digital conversion operation according to the embodiments of FIGS. 1 through 13. The receiver 1012 may receive an analog signal through the antenna 1018, convert the analog signal into a digital signal using the analog-to-digital converting circuit 10, and provide the digital signal to the communication module 1020. The transmitter 1016 may receive a digital signal from the communication module 1020, convert the digital signal into an analog signal, and output the analog signal through the antenna 1018.

The communication module 1020 may include a modem processor 1022, a reduced instruction set computer (RISC)/digital signal processor (DSP) 1024, a controller/processor 1026, a memory 1028, an I/O device 1030, and a phase-locked loop (PLL) 1032.

The modem processor 1022 may perform processing operations, such as encoding, modulation, demodulation, and decoding, to transmit and receive data. The RISC/DSP 1024 may perform a general or specialized processing operation in the communication device 1000. The controller/processor 1026 may control blocks of the communication module 1020. The memory 1028 may store data and various instructions code. The I/O device 1030 may communicate with the external I/O device 1040. The I/O device 1030 may include the analog-to-digital converting circuit 10 performing analog-to-digital conversion according to the embodiments described with reference to FIGS. 1 through 13. The I/O device 1030 may convert a data signal received from the external I/O device 1040 into a digital signal using the analog-to-digital converting circuit 10. The external I/O device 1040 may include an input (a camera, microphone, touch-panel, and/or the like) and/or output (a display, a speaker, haptic feedback, and/or the like) device. The PLL 1032 may perform frequency modulation using a frequency signal received from the reference oscillator 1042. The reference oscillator 1042 may include a crystal oscillator (XO), a voltage controlled crystal oscillator (VCXO), and/or a temperature compensated crystal oscillator (TCXO). The communication module 1020 may perform a processing operation (e.g., for communication) using an output signal generated by the PLL 1032.

Figure 15:
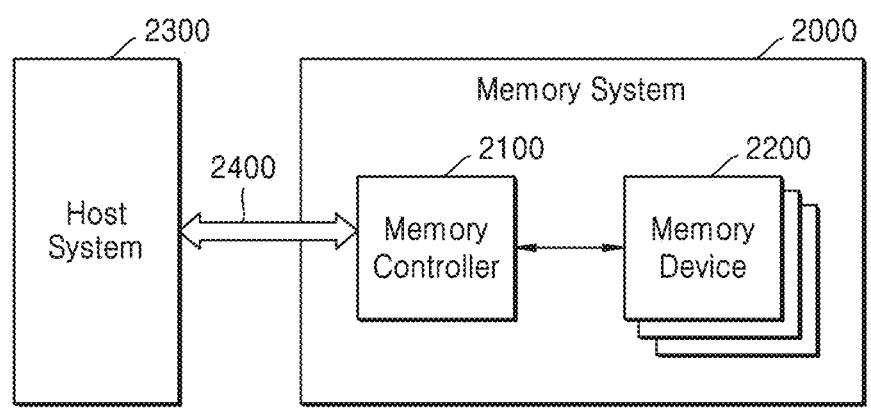
FIG. 15 is a block diagram illustrating systems according to some example embodiments.

FIG. 15 is a block diagram illustrating systems according to an example embodiment.

Referring to FIG. 15, a memory system 2000 and a host system 2300 may communicate with each other through an interface 2400. The memory system 2000 may include a memory controller 2100 and memory devices 2200.

The interface 2400 may use an electrical signal and/or an optical signal. For example, the interface 2400 may include at least one of a serial advanced technology attachment (SATA) interface, a SATA express (SATAe) interface, a serial attached small computer system interface (SCSI) (SAS), a universal serial bus (USB) interface, and/or the like. The host system 2300 and the memory controller 2100 may include a serializer/deserializer (SerDes) for serial communication.

In some example embodiments, the memory system 2000 may be configured to be removably coupled to the host system 2300 and may communicate with the host system 2300. The memory devices 2200 may include volatile memory and/or non-volatile memory. The memory system 2000 may be called a storage system. For example, the memory system 2000 may include at least one of a solid-state drive (or disk) (SSD), an embedded SSD (eSSD), a multimedia card (MMC), an embedded MMC (eMMC), and/or the like. The memory controller 2100 may control the memory devices 2200 in response to a request received from the host system 2300 through the interface 2400.

The analog-to-digital converting circuit 10 according to example embodiments may be included in at least one of (and/or each of) the memory controller 2100, the memory devices 2200, and the host system 2300. For example, the memory controller 2100, the memory devices 2200, and the host system 2300 may receive a data signal based on pulse amplitude modulation (PAM) and convert the data signal into digital data using the method according to the example embodiments.

Figure 16:
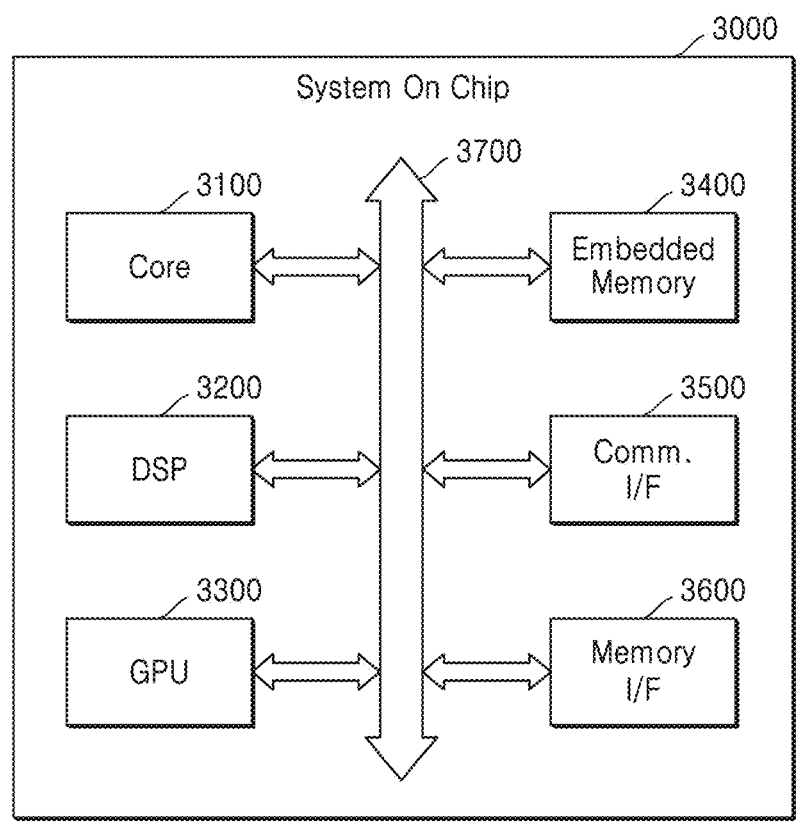
FIG. 16 is a block diagram of a system-on-chip (SoC) according to some example embodiments.

FIG. 16 is a block diagram of a system-on-chip (SoC) according to some example embodiments.

A SoC 3000 may refer to an integrated circuit in which components of a computing system (and/or another electronic system) are integrated. For example, an application processor (AP), as an example of the SoC 3000, may include a processor and components for other functions.

Referring to FIG. 16, the SoC 3000 may include a core 3100, a DSP 3200, a graphics processing unit (GPU) 3300, an embedded memory 3400, a communication interface 3500, and/or a memory interface 3600. The elements of the SoC 3000 may communicate with one another through a bus 3700.

The core 3100 may process instructions and control the operations of the elements of the SoC 3000. For example, the core 3100 may drive an operating system (OS) by processing a series of instructions and execute applications on the OS. The DSP 3200 may generate useful data by processing a digital signal, for example, provided from the communication interface 3500. The GPU 3300 may generate data, which corresponds to an image output through a display device, from image data provided from the embedded memory 3400 or the memory interface 3600 or may encode the image data. The embedded memory 3400 may store data necessary for the operations of the core 3100, the DSP 3200, and the GPU 3300. The memory interface 3600 may provide an interface for an external memory of the SoC 3000 (e.g., dynamic random access memory (DRAM) or flash memory).

The communication interface 3500 may process and/or provide serial communication with the outside of the SoC 3000. For example, the communication interface 3500 may access Ethernet and include a SerDes for serial communication.

The analog-to-digital converting circuit 10 according to the example embodiments may be applied to the communication interface 3500 and/or the memory interface 3600. For example, the communication interface 3500 and/or the memory interface 3600 may receive a data signal based on PAM and convert the data signal into digital data using the method according to the example embodiments.

While the inventive concepts have been particularly shown and described with reference to some example embodiments thereof, it will be understood that various changes in form and details may be made therein without departing from the spirit and scope of the following claims.

What is claimed is:

1. An analog-to-digital converting circuit for converting an analog signal into a digital signal, the analog-to-digital converting circuit comprising:
   a plurality of reference voltage generators each configured to generate a reference voltage;
   an analog-to-digital converter configured to
      generate a comparison voltage based on the reference voltage and the analog signal, and
      generate the digital signal corresponding to the analog signal based on a result of comparing the comparison voltage with a common voltage; and
   a plurality of decoupling capacitors connected to the plurality of reference voltage generators, respectively,
   wherein at least one of the plurality of decoupling capacitors is connected to the analog-to-digital converter in each of a plurality of time periods,
   wherein the plurality of time periods includes a first conversion period and a second conversion period after the first conversion period,
   wherein the plurality of decoupling capacitors comprises
      a first decoupling capacitor configured to provide charges to the analog-to-digital converter in the first conversion period, and
      a second decoupling capacitor configured to provide charges to the analog-to-digital converter in the second conversion period, and
   wherein the charges provided during the second conversion period are smaller than the charges provided during the first conversion period.

2. The analog-to-digital converting circuit of claim 1, wherein each of the plurality of reference voltage generators comprises a low-dropout regulator (LDO).

3. The analog-to-digital converting circuit of claim 1, wherein the analog-to-digital converter comprises:
   a capacitor array including a plurality of comparison voltage capacitors;
   a comparator configured to compare the comparison voltage with the common voltage; and
   a switch array including a plurality of switches respectively corresponding to the plurality of comparison voltage capacitors, the plurality of switches configured to be turned on or off in correspondence to respective bits included in the digital signal.

4. The analog-to-digital converting circuit of claim 3, wherein the turning on or off generates different comparison voltages for the respective bits.

5. The analog-to-digital converting circuit of claim 1, wherein,
   when the at least one of the plurality of decoupling capacitors is connected to the analog-to-digital converter, a peak current is provided to the analog-to-digital converter.

6. The analog-to-digital converting circuit of claim 5, wherein the comparison voltage is generated based on charges provided from the at least one of the plurality of decoupling capacitors.

7. The analog-to-digital converting circuit of claim 1, wherein the plurality of time periods further includes:
   a sampling period during which the analog signal is sampled; and
   a reset period during which the comparison voltage is reset, and
   wherein the analog-to-digital converter is configured to receive the charges from the first decoupling capacitor in the reset period and the charges from the second decoupling capacitor in the sampling period.

8. The analog-to-digital converting circuit of claim 1, wherein
   a first number of bits, starting from a most significant bit (MSB), are converted during the first conversion period, and a second number of bits are converted during the second conversion period after the first conversion period.

9. The analog-to-digital converting circuit of claim 8, wherein a range of fluctuation of the reference voltage generated in the first conversion period is greater than a range of fluctuation of the reference voltage generated in the second conversion period.

10. An analog-to-digital converting circuit for converting an analog signal into a digital signal, the analog-to-digital converting circuit comprising:
   a plurality of reference voltage generation circuits including a first reference voltage generation circuit and a second reference voltage generation circuit;
   an analog-to-digital converter configured to generate a digital signal corresponding to an analog signal based on a reference voltage provided from the plurality of reference voltage generation circuits; and
   a plurality of switches respectively configured to control connections between the analog-to-digital converter and the plurality of reference voltage generation circuits,
   wherein one of the plurality of switches is configured to be activated and connect one of the plurality of reference voltage generation circuits to the analog-to-digital converter during one of a plurality of time periods,
   wherein the plurality of time periods includes a first conversion period and a second conversion period after the first conversion period,
   wherein each of the plurality of reference voltage generation circuits comprises at least one decoupling capacitor configured to provide a peak current to the analog-to-digital converter, and
   wherein the peak currents provided during the second conversion period are smaller than the peak currents provided during the first conversion period.

11. The analog-to-digital converting circuit of claim 10, wherein the analog-to-digital converter comprises:
   a capacitor array including a plurality of comparison voltage capacitors;
   a comparator configured to compare a comparison voltage with a common voltage; and
   a switch array including a plurality of switches respectively corresponding to the plurality of comparison voltage capacitors, the plurality of switches configured to be turned on or off based on respective bits included in the digital signal.

12. The analog-to-digital converting circuit of claim 10, wherein, when at least one of the plurality of reference voltage generation circuits is connected to the analog-to-digital converter, the peak current is provided to the analog-to-digital converter.

13. The analog-to-digital converting circuit of claim 10, wherein the first reference voltage generation circuit comprises a first decoupling capacitor configured to provide charges to the analog-to-digital converter in the first conversion period, and
the second reference voltage generation circuit comprises a second decoupling capacitor configured to provide charges to the analog-to-digital converter in the second conversion period,
wherein a comparison voltage is generated based on charges provided from the plurality of reference voltage generation circuits.

14. The analog-to-digital converting circuit of claim 13, wherein
   a first number of bits, starting from a most significant bit (MSB), are converted during the first conversion period, and
   a second number of bits are converted during the second conversion period after the first conversion period.

15. The analog-to-digital converting circuit of claim 14, wherein a capacitance of the first decoupling capacitor is different from a capacitance of the second decoupling capacitor.

16. The analog-to-digital converting circuit of claim 15, wherein a range of fluctuation of the reference voltage generated in the first conversion period is greater than a range of fluctuation of the reference voltage generated in the second conversion period.

17. A method of converting an analog signal to a digital signal, the method comprising:
   generating, by a first reference voltage generation circuit, a first reference voltage during a first time period;
   providing the first reference voltage to an analog-to-digital converter;
   generating a comparison voltage based on the first reference voltage and the analog signal;
   generating, by a second reference voltage generation circuit, a second reference voltage during a second time period different from the first time period;
   providing the second reference voltage to the analog-to-digital converter;
   generating the comparison voltage based on the second reference voltage and the analog signal; and
   performing an analog-to-digital conversion operation based on the comparison voltage and a common voltage in at least one of the first time period and the second time period,
   wherein a first number of bits, starting from a most significant bit (MSB), are converted during the first time period, and
   a second number of bits are converted during the second time period after the first time period.

* * * * *